(12) United States Patent
Kanda et al.

(10) Patent No.: US 6,208,582 B1
(45) Date of Patent: Mar. 27, 2001

(54) MEMORY DEVICE INCLUDING A DOUBLE-RATE INPUT/OUTPUT CIRCUIT

(75) Inventors: Tatsuya Kanda; Hiroyoshi Tomita, both of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/304,518

(22) Filed: May 4, 1999

(30) Foreign Application Priority Data

Oct. 8, 1998 (JP) .................................................. 10-286488

(51) Int. Cl.$^7$ ....................................................... G11C 8/00
(52) U.S. Cl. ........................................ 365/233; 365/189.04
(58) Field of Search ............................... 365/189.04, 233

(56) References Cited

U.S. PATENT DOCUMENTS 5,537,354 * 7/1996 Mochizuki et al. ............ 365/189.04

* cited by examiner

Primary Examiner—David Nelms
Assistant Examiner—M. Tran
(74) Attorney, Agent, or Firm—Arent Fox Kintner Plotkin & Kahn, PLLC

(57) ABSTRACT

A memory device, which writes data upon receiving a write command and reads data upon receiving a read command, comprises: a data input/output circuit for inputting and outputting the data in synchronization with first and second edges of a clock; and a cell array including a plurality of memory cells which store the data are. The memory device includes two sets of data bus lines connected to the cell array via column gates, a serial/parallel converter for inputting and outputting first and second write data, and two write amplifiers for driving the two data bus lines in accordance with the first and the second write data from the serial/parallel converter. The write amplifiers are activated in a write enabled state and the write amplifier is deactivated in response to a data mask signal despite being in the write enable state. The memory device has a column decoder which selects the column gate, and is inhibited the activation in response to the data mask signal. Therefore, the write-interrupt-read operation can appropriately be performed for a memory device which is compatible with the double data rate.

10 Claims, 7 Drawing Sheets

DDR type memory device

DDR type memory device

Write- interrupt-read operation of first embodiment

Write inhibitting operation of second embodiment

Timing chart for write-interrupt-read in conventional

MEMORY DEVICE INCLUDING A DOUBLE-RATE INPUT/OUTPUT CIRCUIT

BACKGROUND OF THE INVENTION

1. Field of the Invention

The present invention relates to a memory device, compatible with a double data rate, for inputting and outputting data in synchronization with the leading edge and the trailing edge of a clock. In particular, the present invention pertains to a memory device for performing an innovative write-interrupt-read operation and a data mask operation.

2. Related Arts

Synchronous DRAM (SDRAM) for inputting and outputting data in synchronization with a clock has been drawing attention as DRAM with high-speed processing. SDRAM receives a command composed of a number of control signals and an address signal in synchronization with the leading edge of a clock, and receives and outputs data in synchronization with the leading edge of the clock.

SDRAM has a burst mode wherein, while a word line is kept to be driven, the reading or writing of a plurality of data sets is sequentially performed in response to read commands or to write commands. Since a plurality of data sets can be read or written in the burst mode, for a single the word line driving, and a sense amplifier activation/reset, the access time for each bit can be reduced.

For the burst write, a data mask operation is provided which inhibits the writing of data at an arbitrary timing. For example, in the burst writing of four bits, a data mask signal is supplied in synchronization with the input of the third write data, so that the writing of the third write data is inhibited.

In addition, a write interrupt-read-operation is provided by which, during burst write, a read command is supplied to forcibly terminate the burst write operation and to interrupt the read operation. In order to perform the write-interrupt-read operation, a data mask signal must be supplied before a read command is issued according to the specifications for SDRAM.

FIG. 6 is a diagram illustrating a column circuit in a conventional SDR (Signal Data Rate) type SDRAM. A plurality of memory cells are provided in a memory array MCA, each memory cell including one transistor and one capacitor which are located at the intersections of a word line WL and paired bit lines BL and /BL. A sense amplifier S/A is connected to the bit lines BL and /BL, and is connected via a column gate CLG to paired data bus lines DB and /DB. The column gate CLG is rendered conductive or non-conductive in accordance with a column select signal CL, which is issued by a column decoder CDEC.

A data input/output terminal DQ is connected to a data output buffer 10 and a data input buffer 12. Read data DOUT is transferred from a sense buffer S/B, which is activated during the reading process, to the data output buffer 10. Write data DIN is transferred from the data input buffer 12 to a write buffer W/A, which is activated during the writing process. A read/write clock CLK-RW is generated in response to a read command or to a write command, and upon receiving this clock CLK-RW, a column decoder control circuit 18 generates a column decoder activation signal CD to render the column decoder CDEC in the active state for a specific period of time. During this period of time, the column decoder CDEC continues to render the column gate CLG in the conductive state in accordance with the column select signal CL. In addition, during this period of time, a short transistor ST for short-circuiting the paired data bus lines is maintained in the non-conductive state.

A read enable signal RE is generated in accordance with a read command, and upon receiving the read enable signal RE, a sense buffer control circuit 14 generates a read control signal REN for rendering the sense amplifier S/B in the active state for the above specific period of time. In addition, a write enable signal WE is generated in accordance with a write command, and upon receiving this write enable signal WE, a write amplifier control circuit 16 generates a write control signal WEN for rendering a write amplifier W/A in the active state during the above period of time.

FIG. 7 is a timing chart showing the write-interrupt-read operation performed by the SDR type memory device in FIG. 6. In the example in FIG. 7 the burst length is 4. A write command WRITE is supplied in synchronization with the leading edge of a clock at time t0, and write data D0 and D1 are received in synchronization with the leading edges of clocks at time t0 and t1, respectively, and are written. A data mask signal DQM is supplied in synchronization with the leading edge of a clock at time t2, and a read command READ is supplied in synchronization with the leading edge of a clock at time t3. The reading operation interrupts the write operation.

Write data D0 to D3 are input at a data input/output terminal DQ in synchronization with the leading edges of clocks following time t0. These data are fetched into the data input buffer 12, and are transmitted as input data DIN to the write amplifier W/A. In response to the write command WRITE, an internal reading/writing clock CLK-RW is generated, and in response to this clock CLK-RW, the column decoder control circuit 18 generates a column decoder activation signal CD. In response to the column decoder activation signal CD, the column decoder CDEC generates a column select signal CL, so that the write amplifier control circuit 16 generates a write control signal WEN. Upon receiving the write control signal WEN, the write amplifier W/A drives the paired data bus lines DB and /DB in accordance with the write data, and writes the data via the column gate CLG to the memory cell MC.

The read/write clock CLK-RW is internally generated in synchronization with the leading edge of the clock CLK. In the example in FIG. 7, the write data D0 and D1, which are input at time t0 and time t1, are respectively written via the data bus lines DB and /DB to the memory cell MC.

Before the read command is interrupted at time t3, the data mask signal DQM is input at time t2 . In response to the input of the data mask signal DQM, an internal mask signal MASK is generated. Upon receiving the internal mask signal MASK, the write amplifier control circuit 16 does not generate a write control signal WEN, even when the write enable WE signal indicates the device is in the write enable state, so as to deactivate the write amplifier W/A and inhibit the writing of data D2. Further, when at time t3 the read command READ is supplied, the write enable signal WE is reset to the write disable state, and the write amplifier control circuit 16, which does not generate a write control signal WEN, deactivates the write amplifier W/A and inhibits the writing of the data D3. At the same time, the sense buffer control circuit 14 generates a read control signal REN in response to the read state of the read enable signal RE, and permits the sense buffer S/B to amplify the read data Q0, which are output to the data bus lines DB and /DB. The read data Q0 are transmitted to the data output buffer 10 in synchronization with the leading edge of the next clock at time t4, and are output at the data input/output terminal DQ in synchronization with the following clock at time t5.

The write amplifier control circuit 16 can inhibit the writing of data D2 only by deactivating the write amplifier W/A in response to the data mask signal DQM at time t2. Therefore, in response to the read/write clock CLK-RW, the column decoder control circuit 18 outputs the column decoder activation signal CD to generate a column select signal CL. As a result, the column gate CLG is opened, the paired data bus lines DB and /DB are driven by the sense amplifier S/A, and the read data Q2 are output thereto. It should be noted that the read data Q2 are data stored in the memory cell in association with the driving of the word line WL, and are not externally output because the sense buffer S/B is deactivated.

As is described above, according to a conventional SDRAM, first the data mask signal DQM is supplied and then the read command READ is supplied in order to forcibly interrupt the reading operation during the burst write operation. Therefore, in a clock cycle before the read command is supplied, the paired data bus lines DB and /DB are not driven at a large write amplitude by the write amplifier W/A. The data bus lines DB and /DB can be satisfactorily reset during an adequate period of time $\widehat{x}T$ (shown in FIG. 7) before the read data are output to the data bus lines DB and /DB in accordance with the next read command.

Conventional SDRAM is an SDR (Single Data Rate) type which only inputs and outputs data in synchronization with the leading edge of a clock. A DDR (Double Data Rate) type memory device has been proposed which enables higher speed processing. The DDR type memory device inputs and outputs data in synchronization with the leading edge and the trailing edge of a clock. Therefore, a memory controller transmits data to and receives data from the memory device at a double data rate.

However, how the write interrupt-read-operation should be performed for the DDR type memory device has not been proposed. In addition, since the DDR type memory device has a circuit structure which differs from that of the SDR type memory device, it is difficult for the write-interrupt-read operation of conventional SDRAM be applied unchanged for the DDR type memory device.

SUMMARY OF THE INVENTION

It is, therefore, one objective of the present invention to provide a memory device compatible with a double data rate which performs an innovative write-interrupt-read operation.

It is another objective of the present invention to provide a memory device compatible with a double data rate which can perform a read operation appropriately even when a read command interrupts driving a burst write.

To achieve the above objectives, according to the present invention, a memory device, which writes data upon receiving a write command and reads data upon receiving a read command, comprises:

a data input/output circuit for inputting and outputting the data in synchronization with first and second edges of a clock;

a cell array including a plurality of memory cells which store the data;

first and second data bus lines connected to the cell array via column gates;

a serial/parallel converter for inputting and outputting first and second write data which are supplied to the data input/output circuit in synchronization with the first and the second edges of the clock;

first and second write amplifiers for driving the first and the second data bus lines in accordance with the first and the second write data which are output by the serial/parallel converter;

a write amplifier control circuit for activating the first and the second write amplifiers when in a write enabled state as indicated by the write command, and for deactivating the first and/or the second write amplifier in response to a data mask signal despite being in the write enable state; and a column decoder control circuit for controlling activation of a column decoder which selects the column gate, and for inhibiting the activation of the column decoder in response to the data mask signal which is supplied in synchronization with the first and the second edges of the clock.

According to the present invention, the write-interrupt-read operation can appropriately be performed for a memory device which is compatible with the double data rate. In particular, even if the internal write operation is initiated after the first and the second write data have been fetched in response to a write command, the succeeding read operation can appropriately be preformed by deactivating the write amplifier and the column decoder in response to the data mask signal.

Further, according to the above present invention, when the data mask signals are sequentially supplied in synchronization with the first and the second edges of a clock, the column decoder control circuit inhibits the activation of the column decoder so as to inhibit the selection of the column gate.

Furthermore, according to the above present invention, the column decoder control circuit activates the column decoder when the data mask signal is supplied in synchronization with either the first or the second edge of the clock.

According to the above present invention, when the data mask signals are sequentially supplied in synchronization with the first and the second edges of the clock, the column decoder is deactivated and the succeeding read operation is ensured. When the data mask signal is supplied in synchronization with either the first or the second edge of the clock, the column decoder is activated, and the write amplifier corresponding to the data mask signal is deactivated.

DETAILED DESCRIPTION OF THE PREFERRED EMBODIMENTS

The preferred embodiments of the present invention will now be described while referring to the accompanying drawings. It should be noted, however, that the technical scope of the present invention is not limited to these embodiments.

Figure 1:
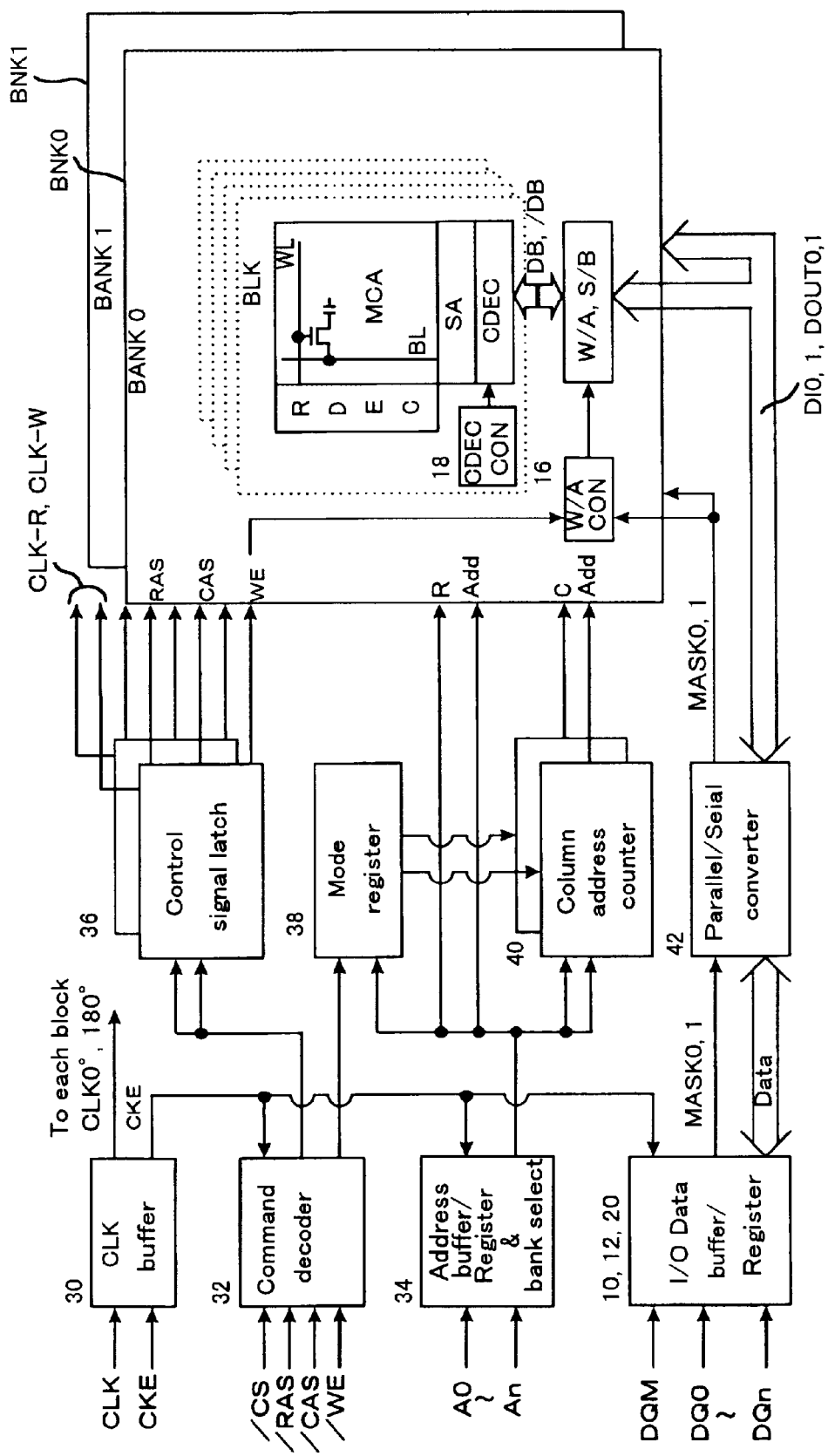
FIG. 1 is a diagram illustrating the general arrangement of a memory device.

FIG. 1 is a diagram illustrating the general arrangement of a memory device. In the example in FIG. 1, two memory banks BNK0 and BNK1 each include a plurality of memory blocks BLK. Each memory block BLK comprises a memory cell array MCA, a row decoder RDEC, a column decoder CDEC and a sense amplifier SA. In the memory banks BNK0 and BNK1, two pair of data bus lines DB and /DB and two write amplifiers W/A, and two sense buffers S/B are provided for one input/output terminal DQ. As in the prior art, a column decoder control circuit 18 and a write amplifier control circuit 16 are also provided in each memory block and memory bank.

A clock CLK and a clock enable signal CKE are provided by an external memory controller to a clock buffer 30. A clock CLK0° at the leading edge (phase 0°) of a clock CLK and a clock CLK180° at the trailing edge (phase 180°) of the clock CLK are provided to the individual internal blocks.

In synchronization with clock CLK0°, a command decoder 32 inputs control signals /CS, /RAS, /CAS and /WE for generating a command, and decodes them to detect the internal state. A burst length and other parameters, such as a write latency and a column latency, are stored in a mode register 38. A control signal latch circuit 36 generates a write enable signal WE, a read enable signal RE, a write clock CLK-W and a read clock CLK-R at a predetermined timing, and provides them to the memory banks according to the detected internal state which is decoded by the command decoder 32.

An address buffer/register and bank selector 34 receives address signals A0 to An in synchronization with the clock CLK0°, and provides a row address and a column address to the memory banks. In the example in FIG. 1, an address signal An is used as a memory bank select signal. In burst mode, a column address counter 40 increments a column address in accordance with the column address provided together with the command, and provides the incremented column address to the memory banks.

An I/O data buffer/register 10, 12 or 20 includes the data output buffer 10, the data input buffer 12 and the data mask signal DQM input buffer 20 which were described in the prior art. Since the memory device in FIG. 1 is compatible with the double data rate (DDR), the data input/output buffers 10 and 12 and the data mask input buffer 20 input and output input/output data DQ and a data mask signal DQM in synchronized with the clock CLK0° and CLK180°.

The DDR type memory device in FIG. 1 also includes serial/parallel converter 42, for internally providing the data in parallel which is input at the double data rate; and a parallel/serial converter 42, for providing data to the data output buffer 10 which is output at the double data rate. These converters 42 are connected to the write amplifiers W/A and the sense buffers S/B by two sets of write data signal lines DIN0 and DIN1 and read data signal lines DOUT0 and DOUT1. When the data input/output terminals DQ are composed of 16 bits wide, two sets of the write data signal lines DIN0 and DIN1, the read data signal lines DOUT0 and DOUT1, the data bus lines DB and /DB, the write amplifiers W/A and the sense buffers S/B are provided to each terminals DQ, and the total circuit structure includes 32 sets of these circuits.

Figure 2:
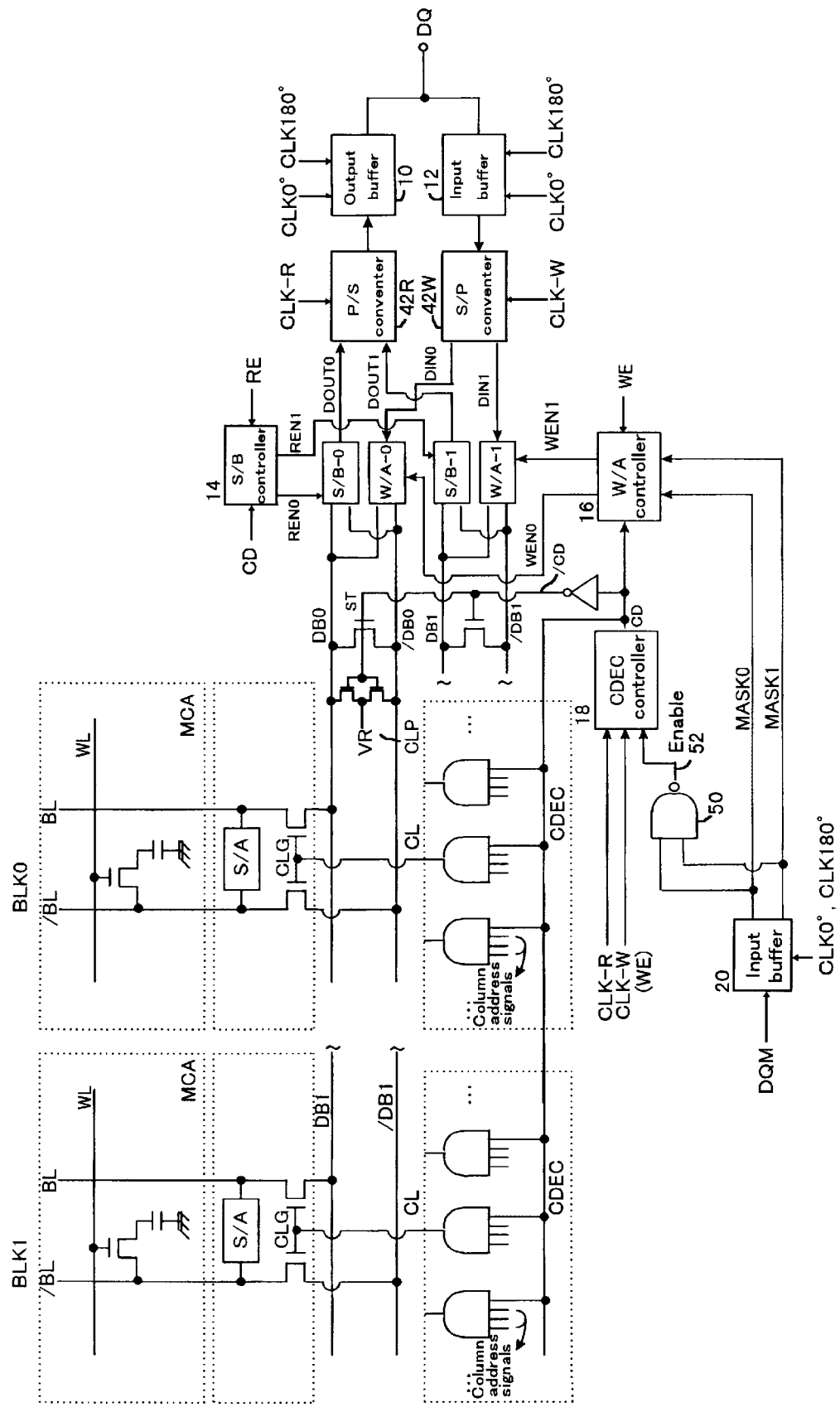
FIG. 2 is a detailed circuit diagram showing a DDR (Double Data Rate) type memory device according to the present invention.

FIG. 2 is a detailed circuit diagram illustrating a DDR type memory device according to the present invention. A data input buffer 12 fetches, in serial, two sets of write data at the data input/output terminal DQ in synchronization with the internal clocks CLK0° and CLK180°. In response to a write clock CLK-W for controlling the initiation of writing operation, a serial/parallel converter 42W outputs, in parallel, two sets of write data to the write data lines DIN0 and DIN1. In accordance with the first write data line DIN0, a first write amplifier W/A-0 drives the first pair of data bus lines DB0 and /DB0. In accordance with the second write data line DIN1, a second write amplifier W/A-1 drives the second pair of data bus lines DB1 and /DB1. The first and the second write amplifiers W/A-0 and W/A-1 are activated in response to the first and the second write control signals WEN0 and WEN1, which are generated by a write amplifier control circuit 16.

The first and the second data bus line pairs, DB0 and /DB0, and DB1 and /DB1, are connected via corresponding column gates CLG to different memory blocks BLK0 and BLK1 respectively. The column gates CLG are rendered conductive in response to column select signals CL, which are generated by column decoders CDEC, so that two sets of write data are simultaneously written in the different memory cells in the different memory bank BLK0, BLK1.

In the reading operation, the read data are output by the memory blocks BLK0 and BLK1 to the first and the second data bus line pairs DB0 and /DB0, and DB1 and /DB1. In accordance with the levels of the first and the second data bus line pairs, the first and second sense buffers S/B-0 and S/B-1 amplify the respective read data, and provide the resultant read data, in parallel via the read data lines DOUT0 and DOUT1, to a parallel/serial converter 42R. The parallel/serial converter 42R outputs, in serial, two sets of read data to the data output buffer 10, by which the two sets of read data are output serially in synchronization with the internal clocks CLK0° and CLK180°. The first and the second sense buffers S/B-0 and S/B-1 are activated in response to the first and the second read control signals REN0 and REN1, which are generated by the sense buffer control circuit 14 in accordance with the read enable signal RE.

The data mask signal DQM is fetched to the input buffer 20 in synchronization with the clock CLK0° or CLK180°. An internal mask MASK0 is generated in accordance with the data mask signal DQM, which is supplied in synchronization with the clock CLK0°, while an internal mask signal MASK1 is generated in accordance with the data mask signal DQM, which is supplied in synchronization with the clock CLK180°. The internal mask signals MASK0 and MASK1 are provided to the write amplifier control circuit 16 to inhibit the generation of the write control signals WEN0 and WEN1 corresponding to the timing of clock CLK0° or CLK180°. Thus, the write amplifiers W/A-0 and W/A-1 are deactivated at a timing which corresponds to that of the data mask signal DQM, and the corresponding writing operation is inhibited.

The internal mask signals MASK0 and MASK1 are also transmitted via a NAND gate 50 to the column decoder control circuit 18. In response to the write clock CLK-W or the read clock CLK-R, the column decoder control circuit 18 generates, within a predetermined period of time, a column decoder activation signal CD. In response to the column decoder activation signal CD, during the predetermined period of time, the column decoder CDEC outputs a column select signal CL, the write amplifier control circuit 16 generates the write control signals WEN0 and WEN1, and the sense buffer control circuit 14 generates the read control signals REN0 and REN1.

When the data mask signals DQM are sequentially supplied in synchronization with the internal clocks CLK0° and CLK180°, an enable signal 52 goes to level L, and the column decoder control circuit 18 does not generate the column decoder activation signal CD. As a result, the write amplifier control circuit 16 does not generate the write control signals WEN0 and WEN1; instead, it deactivates the write amplifiers W/A-0 and W/A-1. The column decoder CDEC is also deactivated and does not generate the column select signal CL, so that the column gate CLG is rendered non-conductive. Therefore, the writing operations for the data which are received in synchronization with the internal clocks CLK0° and CLK180° are inhibited.

When only one data mask DQM is supplied in synchronization with the internal clock CLK0° or CLK180°, a corresponding internal mask signal MASK0 or MASK1 is generated. The write amplifier control circuit 16 does not generate a corresponding write control signal WEN0 or WEN1; therefore, it deactivates a corresponding write amplifier W/A. Since the enable signal 52 is maintained at level H, the column decoder control circuit 18 generates the column activation signal CD as usual, and the column decoder CDEC outputs the column select signal CL in the period during which the column activation signal CD is active state.

Figure 3:
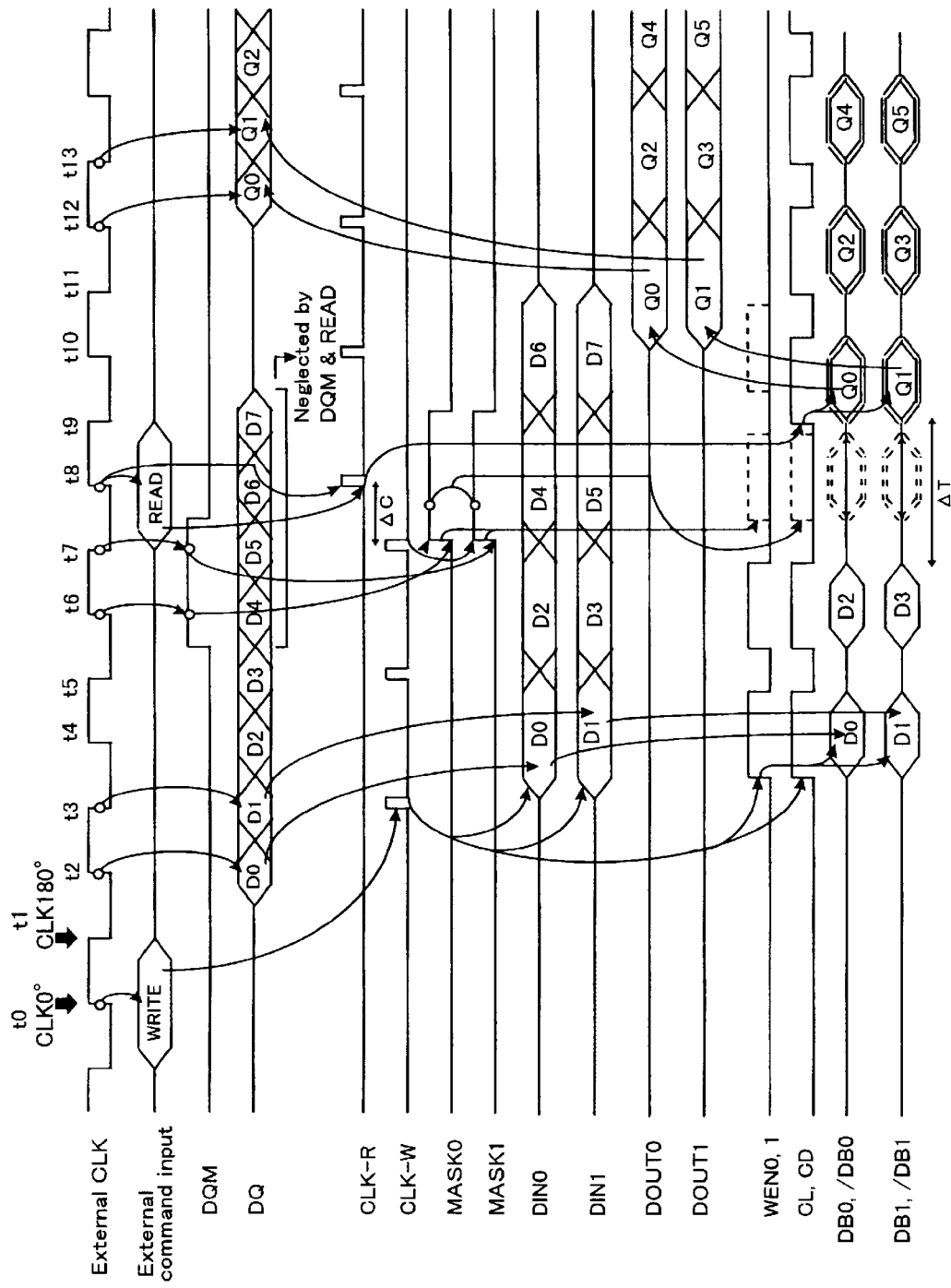
FIG. 3 is a timing chart for a write-interrupt-read operation according to a first embodiment of the present invention.

FIG. 3 is a timing chart for the write-interrupt-read operation according to a first embodiment of the present invention. As is shown in FIG. 3, the leading edge of the external clock CLK corresponds to the internal clock CLK0°, and the trailing edge of the external clock CLK corresponds to the internal clock CLK180°. In the example in FIG. 3, the write command WRITE is supplied in synchronization with the clock CLK0° at time t0. The write command WRITE is decoded by the command decoder 32, and 8-bit write data D0 to D7 are provided serially to the data input/output terminal DQ, in synchronization with the internal clock CLK0° or CLK180°, at a time later than time t2 following a latency of one clock (a write latency). This example is for a burst length of 8.

The feature of the double data rate (DDR) is that, in the writing operation, the internal write clock CLK-W is generated after the two sets of write data have been received in synchronization with the internal clocks CLK0° and CLK180°. That is, upon receiving two sets of write data D0 and D1, the write clock CLK-W is generated, in synchronization with the clock CLK180°, at time t3, and in response to the clock CLK-W, the parallel/serial converter 42W outputs, in parallel, the write data D0 and D1 to the write data lines DIN0 and DIN1.

In response to the write command WRITE, the control signal latch circuit 36 sets the write enable signal WE to the write enabled state. And in response to the write clock CLK-W, the column decoder control circuit 18 generates the column decoder activation signal CD, and permits the column decoder CDEC to generate a column select signal CL. Then, in response to the column decoder activation signal CD, the write amplifier control circuit 16 generates the first and the second write control signals WEN0 and WEN1, so as to activate the first and the second write amplifiers W/A-0 and W/A-1. As a result, the first and the second data bus line pairs, DB0 and /DB0, and DB1 and /DB1, are driven in accordance with the respective write data D0 and D1. And in response to the column select signal CL, the column gate CLG is rendered conductive so that the write data D0 and D1 are written in the memory cells.

In the example in FIG. 3, write data D2 and D3, which are supplied at time t4 and t5, are also written in the memory cells in the above described manner.

In FIG. 3, the data mask signals DQM are sequentially provided in synchronization with the internal clocks CLK0° and CLK180° at time t6 and t7, and the read command READ is supplied in synchronization with the internal clock CLK0° at the succeeding time t8. In this example, the writing operation for the write data D4 to D7, which are supplied in synchronization with the internal clocks at time t6 to t9, is inhibited, and the read operation interrupts the processing in accordance with the read command READ at time t8.

As is shown in FIG. 2, when the data mask signals DQM are sequentially supplied in synchronization with the internal clocks CLK0° and CLK180°, the internal mask signals MASK0 and MASK1 are generated at the same time, and the column decoder control circuit 18 does not generate the column decoder activation signal CD in accordance with the enable signal 52 (Level L). As a result, the column decoder CDEC is not activated and, accordingly, does not generate the column select signal CL, and the column gate CLG is not rendered conductive. In addition, since the column decoder activation signal CD is not generated, even though the write enable signal WE is in the write enable state, the write amplifier control circuit 16 does not generate the first and the second write control signals WEN0 and WEN1 so as to deactivate the first and the second write amplifiers W/A-0 and W/A-1. As a result, the write amplifiers W/A-0 and W/A-1 are not driven by using write data D4 and D5, and the column gate CLG remains closed. The first and the second data bus line pairs, DB0 and /DB0 and DB1 and /DB1, are held at reset level VR by the clump circuits CLP.

Upon receiving the read command READ at time t8, the write enable signal WE is set to the write disabled state, and as the write amplifier control circuit 16 does not generate the write control signals WEN0 and WEN1, the writing operation for write data D6 and D7 is inhibited. On the other hand, the read enable signal RE is set to the read enable state in response to the read command READ. The internal read clock CLK-R is generated in synchronization with the internal clock CLK0° at time t8, upon which the read command READ is supplied. In response to the read clock CLK-R, the column decoder control circuit 14 generates the column decoder activation signal CD and permits the column decoder CDEC to generate the column select signal CL, so that the data Q0 and Q1 in the memory cells are output to the first and the second data bus line pairs DB0 and /DB0, and DB1 and /DB1 respectively. The sense buffer control circuit 14 activates the sense buffers S/B-0 and S/B-1 at the timing for the column decoder activation signal CD, and the read data Q0 and Q1 are provided in parallel to the parallel/serial converter 42R. The read data Q0 and Q1 are output in serial to the data input/output terminal DQ in synchronization with the internal clocks CLK0° and CLK180° at time t12 and t13.

As is described above, in the writing operation for the DDR compatible memory device, the internal write clock CLK-W is generated after the internal clock CLK180°, at which the first and the second write data have been input, so that the write amplifier begins to drive the data bus line pairs, and the column decoder is activated. In the reading operation, on the other hand, the internal read clock CLK-R is generated in response to the internal clock CLK0°, at which time the read command READ is supplied, so that the column decoder CDEC is activated to open the column gate CLG, and the sense amplifier begins to drive the data bus line pairs. Therefore, when a read command READ is issued and interrupts the burst writing as is shown in FIG. 3, it is required for the data mask signals DQM to be sequentially supplied in synchronization with the clocks CLK0° and CLK180°, before the read command READ having not yet been supplied, so that the driving of the data bus line pairs due to the writing operation does not overlap to, or does not closely occur with the driving of the data bus line pairs due to the interrupting read operation. As a result, the data bus lines which have been driven at a large amplitude due to the writing of the write data D2 and D3 can be reset properly during a sufficiently long period ⓧT in FIG. 3.

The data bus line pairs are driven at a comparatively large amplitude by the write amplifier W/A. During a reset period, the data bus lines are reset to the reset level VR by a short-circuit transistor ST and a clamp transistor CLP upon the receipt of an inverted column decoder activation signal /CD. In the reading operation, the data bus line pairs are driven at a very small amplitude by the sense amplifier SA in the memory cell array. Therefore, as is described above, it is preferable that, when the reading operation interrupts the writing operation, a sufficiently long reset time ⓧT be provided.

Figure 4:
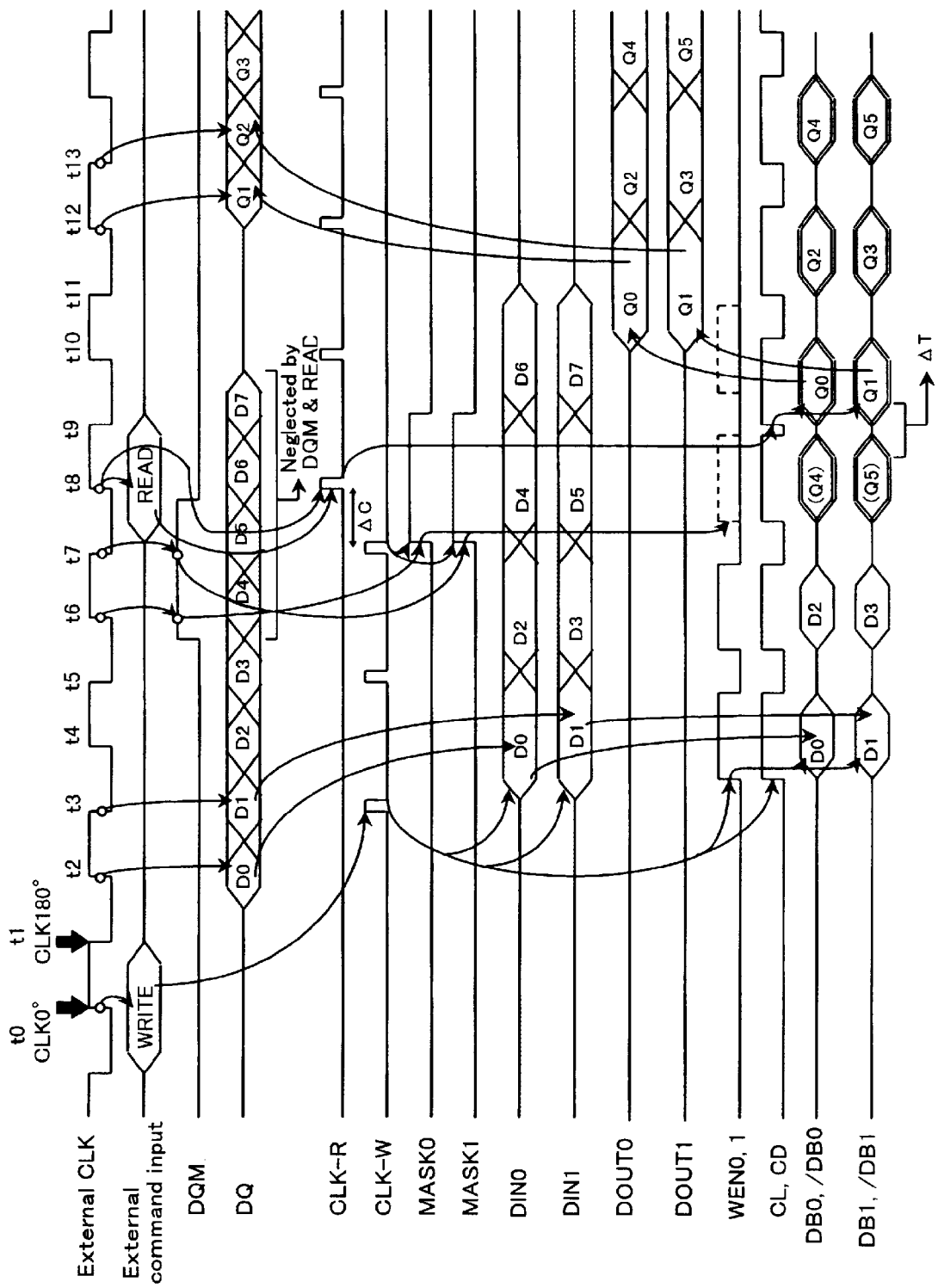
FIG. 4 is a timing chart for explaining the first embodiment.

FIG. 4 is a timing chart for explaining the embodiment. The example in FIG. 4, as well as the example in FIG. 3, shows an example of the write-interrupt-read operation. However in FIG. 4 as in a conventional SDR type memory device, upon receiving the data mask signal DQM, the write amplifier control circuit simply deactivates the write amplifier, while the column decoder control circuit does not deactivate the column decoder CDEC. Therefore, the column select signal CL is generated so that the column gate CLG is rendered conductive, and the data Q4 and Q5 in the memory cells are output to the data bus line pairs. And as a result, the column decoder activation signal CD and the column select signal CL are generated in response to the read command at time t8, without the intervention of a sufficiently long reset time ⓧT following the preceding generation of the column decoder activation signal CD and column select signal CL.

In FIG. 4, the write command WRITE is supplied in synchronization with the internal clock CLK0° at time t0. The operation for the writing of the write data D0 to D3 is performed in the same manner as in FIG. 3. When a data mask signal DQM is supplied at time t6 and t7, the write amplifier control circuit 16 does not generate corresponding write control signals WEN0 and WEN1 so as to deactivate the write amplifiers W/A-0 and W/A-1. Therefore, the write amplifiers do not drive the data bus line pairs based on write data D4 and D5. And in the example in FIG. 4, since as in a conventional SDR type memory device the generation of the column decoder activation signal CD is not inhibited, the column decoder CDEC generates the column select signal CL, so that the column gate CLG is opened, and the data Q4 and Q5 in the memory cell arrays are output to the two data bus line pairs DB0, /DB0 and DB1, /DB1.

As a result, a sufficiently long reset time ⓧT is not ensured until the following column decoder activation signal CD has been generated in response to the read command READ. Thus, it is predicted that in the worst case, the column select signal CL at time t7, at which time the data mask signal DQM is supplied, may be overlapped by the column select signal CL at time t8, at which time the read command READ is supplied, so that different read data Q4, Q5 and Q0, Q1 may be output at the same time to the data bus line pairs. As is described above, since in the DDR type memory device the internal writing operation is initiated following the generation of the clock CLK180°, the time interval ⓧC between the write clock CLK-W and the following read clock CLK-R is short, as is shown in FIGS. 3 and 4. If the column select signal CL is maintained to be active, even upon the receipt of the data mask signal DQM, as in a conventional SDR type memory device, the reading operation in accordance with the following read command READ may not be properly performed. Therefore, the operation in FIG. 3, not in FIG. 4, is preferable.

Figure 5:
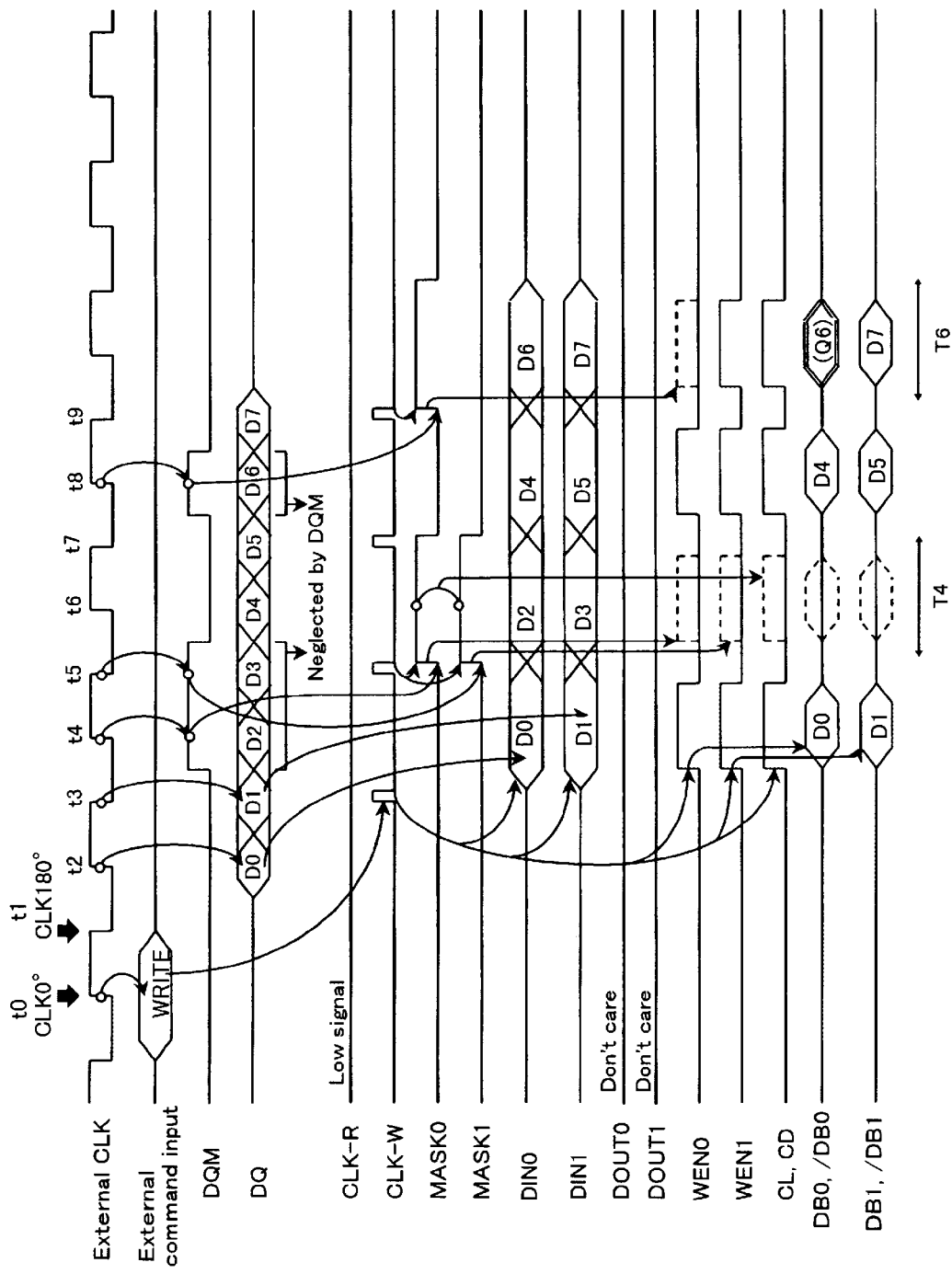
FIG. 5 is a timing chart for an operation for employing a data mask signal to inhibit a writing operation according to a second embodiment of the present invention.
Figure 6:
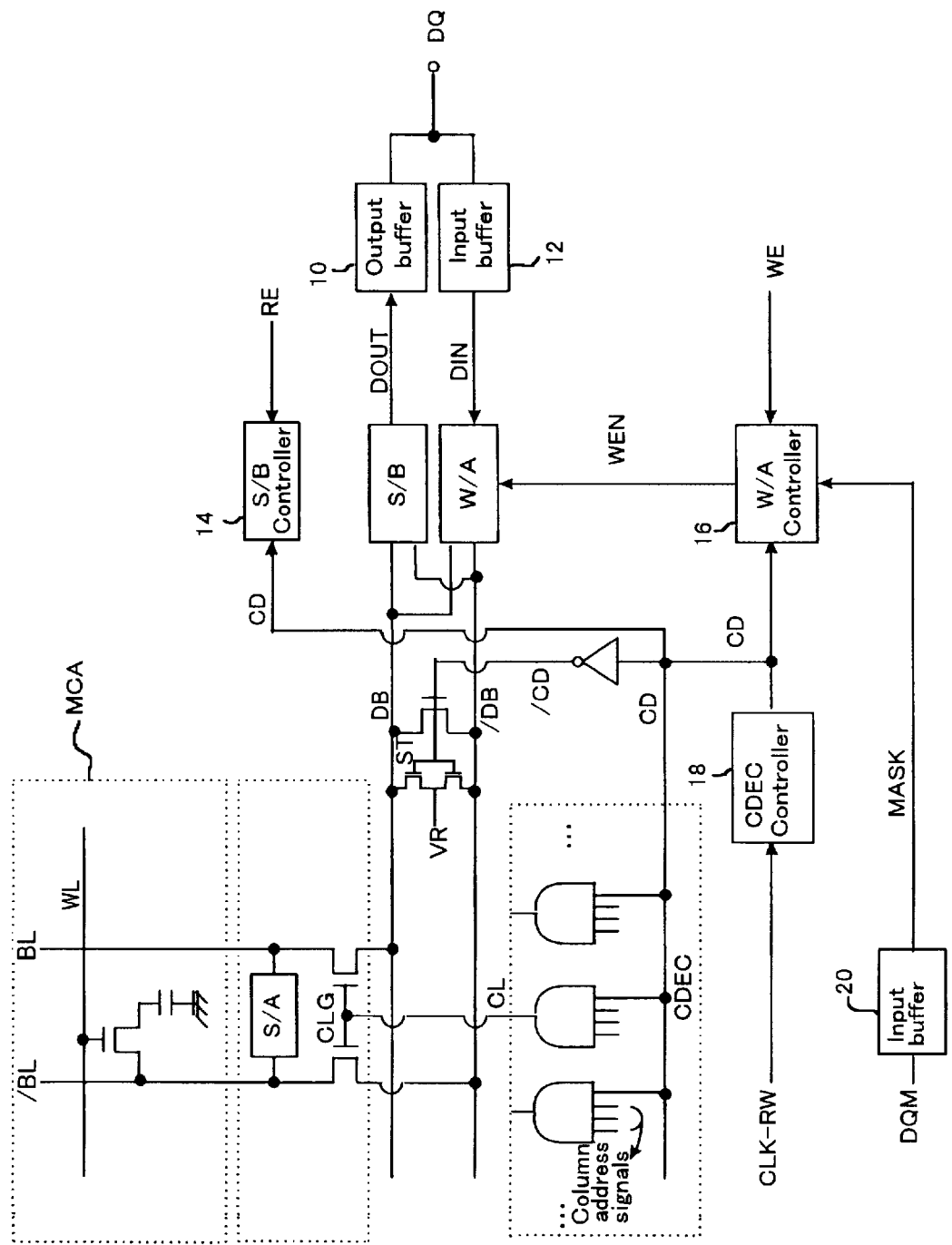
FIG. 6 is a diagram illustrating a column circuit in a conventional SDR (Single Data Rate) type SDRAM.
Figure 7:
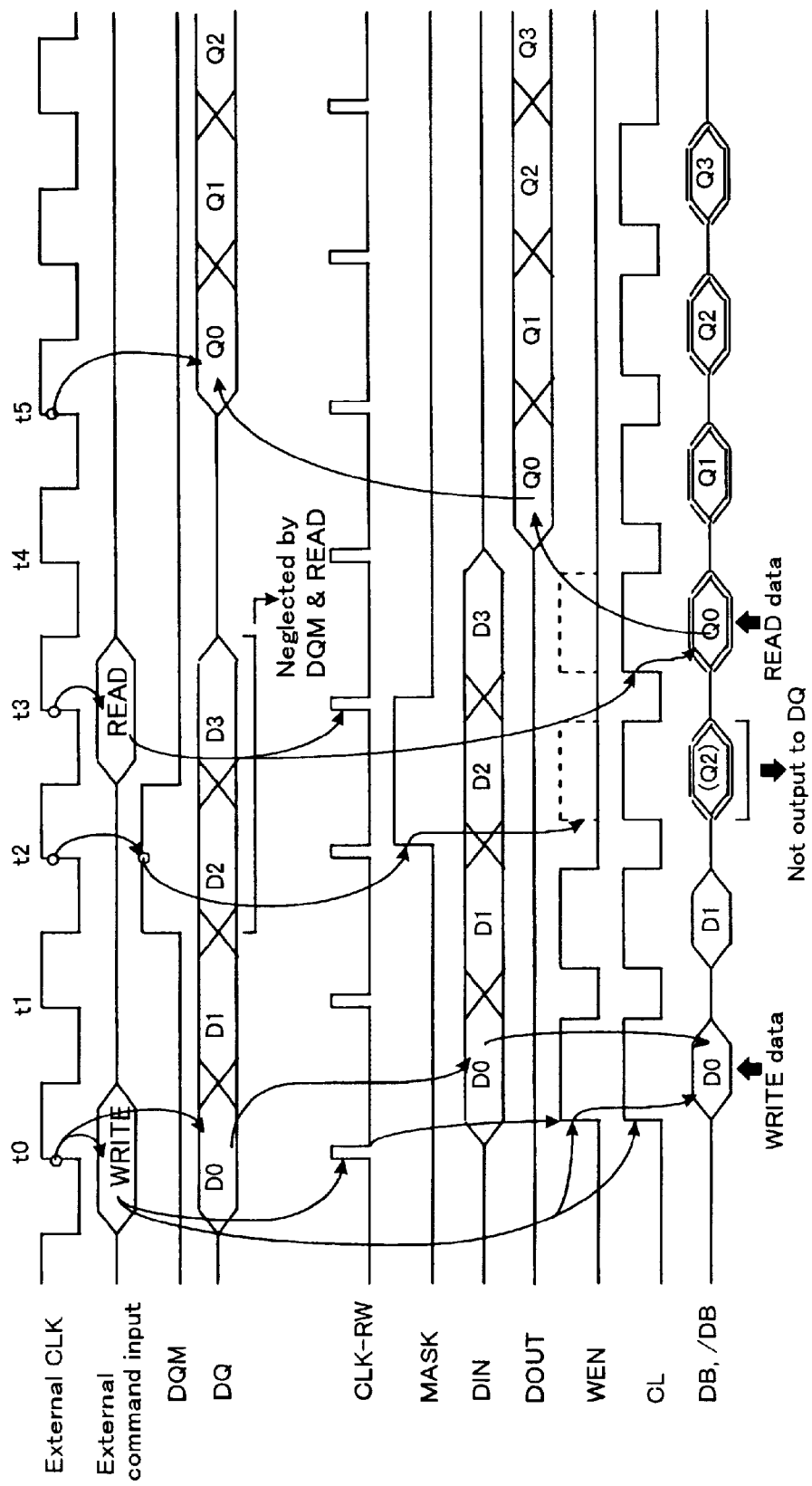
FIG. 7 is a timing chart for a write-interrupt-read operation for the SDR type memory device in FIG. 6.

FIG. 5 is a timing chart for an operation according to a second embodiment of the present invention for employing a data mask signal to inhibit the writing operation. In the second embodiment, when the data mask signals DQM are sequentially transmitted in synchronization with the first and the second edges of a clock, the write amplifier control circuit 16 deactivates the write amplifier W/A and inhibits a writing operation for write data which are received in synchronization with the first and the second edges of the clock. Further, the column decoder control circuit 18 deactivates the column decoder CDEC and prevents the column gate CLG from becoming conductive. Furthermore, when the data mask signal DQM is supplied in synchronization with either the first or the second edge of the clock, the write amplifier control circuit 16 deactivates only one of two corresponding write amplifiers W/A, while it activates the other write amplifier W/A. Therefore, the writing operation is performed for the write data which are provided in synchronization with the edge of a clock for which a data mask signal DQM is not supplied. The column data control circuit 18 generates the column decoder activation signal CD, regardless of the data mask signal DQM, so as to connect to the memory cell arrays, via the column gates, both the first and the second data bus line pairs DB0, /DB0 and DB1, /DB1. As a result, one data bus line pair is driven by the write amplifier and data are written in the memory cell, while data read from the memory cell array are output to the other data bus line pair.

The above processing will be explained while referring to the timing chart in FIG. 5. In the example in FIG. 5, the write command WRITE is supplied in synchronization with the clock CLK0° at time t0. As in the first embodiment in FIG. 3, write data D0 and D1 are input, and the internal write clock CLK-W is generated in synchronization with the clock CLK180° at time t3. Accordingly, the first and the second write amplifiers W/A-0 and W/A-1 are activated, the column decoder activation signal CD and the column select signal CL are generated, and the writing operation is performed.

Then, the data mask signals DQM are sequentially provided in synchronization with the internal clocks CLK0° and CLK180° at time t4 and t5. As a result, as in the first embodiment, during period T4, both of the write control signals WEN0 and WEN1 are not generated so that the write amplifiers W/A-0 and W/A-1 are not activated. Accordingly, neither the column decoder activation signal CD nor the column select signal CL are generated. Therefore, the first and the second data bus line pairs are not driven, and the reset level VR is maintained at the data bus lines during the period T4.

Following this, the data mask signal DQM is supplied in synchronization with the internal clock CLK0° at time t8, while the data mask signal DQM is not supplied in accordance with the internal clock CLK1800° at time t9. That is, the data mask signals DQM are not continuously supplied, but is supplied only at the first or the second edge of the clock CLK. In this case, only the writing of data D6 is inhibited, while the writing of data D7 is not inhibited.

Specifically, when the data mask signal DQM is supplied only at either the first or the second edge of the clock, at the succeeding cycle the read command READ is not issued because of the specifications of the memory device, and write data D7, for which the data mask signal DQM is not supplied, are written. That is, in response to the internal mask signal MASK0, the write amplifier control circuit 16 inhibits the generation of the first write control signal WEN0, and generates only the second write control signal WEN1. As a result, the first write amplifier W/A-0 is not activated, while the second write amplifier W/A-1 is activated, so that the second pair of data bus lines DB1 and /DB1 are driven based on the write data D7. The column decoder control circuit 14 generates the column decoder activation signal CD to generate the column select signal CL. As a result, during period T6 in FIG. 5, the read data Q6 are output by the memory cell array to the first pair of data bus lines DB0 and /DB0, and the write data D7 are output by the write amplifier W/A-1 to the second pair of the data bus lines DB1 and /DB1.

Assume that the column select signal CL corresponding to the first data bus line pair DB0, /DB0 is not generated. Then, the first paired data bus lines DB0 and /DB0 are not driven by the sense amplifier S/A, and may be affected by the large data writing amplitude of the second paired data bus lines DB1 and /DB1, which are adjacently located thereto, and may be changed from the reset level. Since the clamp level VR of the clamp transistor CLP used for resetting the data bus line pair is not capable of supplying a large current, the change in the level described above will occur so long as the first data bus lines DB0 and /DB0 are maintained at the reset level VR. As a result, it is predicted that, in the reading or the writing operation at the next cycle, the normal reset level of the first pair of data bus lines DB0 and /DB0 will be changed, and this will adversely affect the following writing or the reading operation.

As is described above, when, during a burst write operation, the data mask signal DQM is supplied at either the first or the second edge of the clock, it is necessary for a corresponding write amplifier to be deactivated and for the column select signal CL to be generated for both the data bus line pairs in order to prevent an erroneous operation.

As is described above, according to the present invention, in a double data rate compatible memory device, when a read command is issued during a burst write operation, the data bus line pairs are maintained at the reset level in accordance with a preceding data mask signal DQM. Thus, a succeeding read operation can be performed appropriately.

Furthermore, according to the present invention, in a double data rate compatible memory device, both of the first and the second data bus line pairs are driven in response to the data mask signal DQM which is synchronized with either the first or the second edge of a clock during a burst operation. Therefore, a succeeding reading or writing operation can be properly performed.

What is claimed is:

1. A memory device, which writes data upon receiving a write command and reads data upon receiving a read command, comprising:
    a data input/output circuit for inputting and outputting said data in synchronization with first and second edges of a clock;
    a cell array including a plurality of memory cells which store said data;
    first and second data bus lines connected to said cell array via column gates;
    a serial/parallel converter for inputting and outputting first and second write data which are supplied to said data input/output circuit in synchronization with said first and said second edges of said clock;
    first and second write amplifiers for driving said first and said second data bus lines in accordance with said first and said second write data which are output by said serial/parallel converter;
    a write amplifier control circuit for activating said first and said second write amplifiers when in a write enabled state as indicated by said write command, and for deactivating said first and/or said second write amplifier in response to a data mask signal despite being in said write enable state; and
    a column decoder control circuit for controlling activation of a column decoder which selects said column gate, and for inhibiting said activation of said column decoder in response to said data mask signal which is supplied in synchronization with said first and said second edges of said clock.

2. A memory device according to claim 1, further comprising:
    first and second sense buffers for inputting first and second read data which are output to said first and said second data bus lines;
    a parallel/serial converter for receiving in parallel said first and said second read data from said first and said second sense buffers, and for outputting in serial said first and said second read data to said data input/output circuit; and
    a sense buffer control circuit for activating said first and said second sense buffers when in a read enable state according to said read command.

3. A memory device according to claim 1 or 2, wherein, in response to said write command, said write amplifier and said column decoder are activated after said second edge of said clock, at which time said second write data are fetched, and wherein said column decoder is activated in response to the read command which is supplied in synchronization with said first edge of said clock.

4. A memory device according to claim 1 or 2, wherein, when said data mask signal is continuously supplied in synchronization with said first and said second edges of said clock, said column decoder control circuit does not activate said column decoder so as to inhibit the selection of said column gate.

5. A memory device according to claim 1 or 2, wherein, when said data mask signal is supplied at either said first or said second edge of said clock, said column decoder control circuit activates said column decoder.

6. A memory device according to claim 1 or 2, wherein, when said data mask signal is supplied at said first edge of said clock, said write amplifier control circuit deactivates said first write amplifier, and wherein, when said data mask signal is supplied at said second edge of said clock, said write amplifier control circuit deactivates said second write amplifier.

7. A memory device according to claim 1 or 2, wherein, in response to said write command, said write amplifier and said column decoder start being activated after said second edge of said clock, at which time said second write data are fetched, and wherein said column decoder start being activated in response to a read command which is supplied in synchronization with said first edge of said clock.

8. A memory device, for inputting write data and outputting read data in synchronization with first and second edges of a clock, comprising:
    a data bus line connected to a sense amplifier via a column gate;
    a write amplifier for driving said data bus line in accordance with said write data;

a write amplifier control circuit for deactivating said write amplifier in response to a data mask signal in a write mode; and a column decoder control circuit for inhibiting said activation of a column decoder, which selects said column gate, in response to said data mask signal.

9. The memory circuit as claimed in claim 8, wherein said write amplifier drives said data bus line in response to said second edge of the clock, and the memory circuit initiates a read operation to output said read data in response to said first edge of the clock.

10. The memory circuit as claimed in claim 9, wherein the memory circuit receives a read command for conducting said read operation in a next clock cycle after receiving said data mask signal.

* * * * *